(12) United States Patent
Katoh

(10) Patent No.: US 9,171,940 B2
(45) Date of Patent: Oct. 27, 2015

(54) THIN FILM TRANSISTOR SUBSTRATE, DISPLAY DEVICE, AND METHOD FOR MANUFACTURING THIN FILM TRANSISTOR SUBSTRATE

(75) Inventor: Sumio Katoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 170 days.

(21) Appl. No.: 13/979,253

(22) PCT Filed: Jan. 10, 2012

(86) PCT No.: PCT/JP2012/000093
§ 371 (c)(1),
(2), (4) Date: Jul. 11, 2013

(87) PCT Pub. No.: WO2012/096154
PCT Pub. Date: Jul. 19, 2012

(65) Prior Publication Data
US 2013/0292682 A1    Nov. 7, 2013

(30) Foreign Application Priority Data
Jan. 13, 2011 (JP) .................. 2011-004723

(51) Int. Cl.
*H01L 29/04* (2006.01)
*H01L 29/66* (2006.01)
*H01L 29/45* (2006.01)
*H01L 29/786* (2006.01)

(52) U.S. Cl.
CPC .......... *H01L 29/66969* (2013.01); *H01L 29/45* (2013.01); *H01L 29/78606* (2013.01); *H01L 29/78693* (2013.01)

(58) Field of Classification Search
CPC ................ H01L 29/4908; H01L 29/66765
USPC ............................. 257/60; 438/158
See application file for complete search history.

(56) References Cited

U.S. PATENT DOCUMENTS

| | | | |
|---|---|---|---|
| 2006/0214890 A1* | 9/2006 | Morishige et al. | 345/77 |
| 2009/0039352 A1* | 2/2009 | Kobayashi et al. | 257/59 |
| 2010/0025675 A1* | 2/2010 | Yamazaki et al. | 257/43 |
| 2010/0127266 A1* | 5/2010 | Saito et al. | 257/59 |
| 2010/0244029 A1* | 9/2010 | Yamazaki et al. | 257/52 |
| 2013/0001546 A1* | 1/2013 | Kamada et al. | 257/43 |
| 2013/0256798 A1* | 10/2013 | Kinoshita | 257/347 |

FOREIGN PATENT DOCUMENTS

| | | | |
|---|---|---|---|
| JP | 2010-056546 A | 3/2010 | |
| JP | 2010-123748 A | 6/2010 | |
| JP | 2010-251735 A | 11/2010 | |

OTHER PUBLICATIONS

Official Communication issued in International Patent Application No. PCT/JP2012/000093, mailed on Mar. 13, 2012.

Jeong, J. et al., "3.1: Distinguished Paper: 12.1-Inch WXGA AMOLED Display Driven by Indium-Gallium-Zinc Oxide TFTs Array", SID Symposium Digest of Technical Papers, vol. 39, Issue 1, May 2008, pp. 1-4.

* cited by examiner

*Primary Examiner* — Jami M Valentine
(74) *Attorney, Agent, or Firm* — Keating & Bennett, LLP

(57) ABSTRACT

In a thin film transistor substrate (10) having an island-like channel protection layer (15a) covering a channel portion of an oxide semiconductor layer (14), a source electrode (16S) and a drain electrode (16D) are formed of an aluminum alloy film or a multilayer film including an aluminum alloy film.

19 Claims, 12 Drawing Sheets

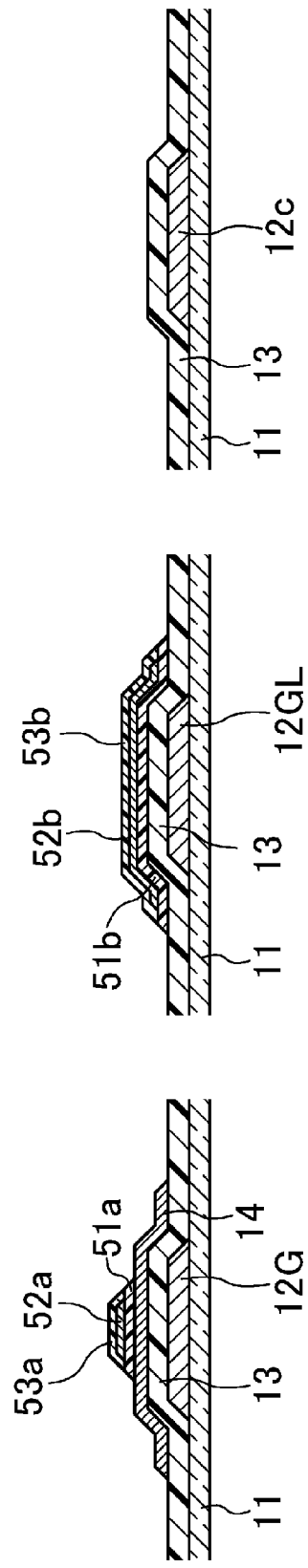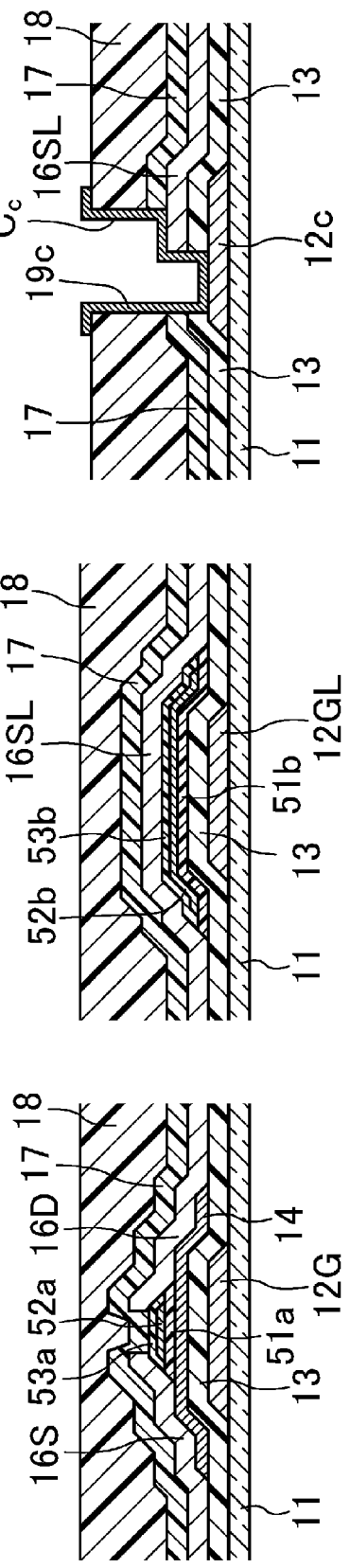

THIN FILM TRANSISTOR SUBSTRATE, DISPLAY DEVICE, AND METHOD FOR MANUFACTURING THIN FILM TRANSISTOR SUBSTRATE

TECHNICAL FIELD

The present invention relates to thin film transistor substrates having thin film transistors including an oxide semiconductor layer, display devices, and methods for manufacturing such thin film transistor substrates.

BACKGROUND ART

As a typical active matrix substrate, a thin film transistor substrate (hereinafter also referred to as a "TFT substrate") is widely used which includes thin film transistors (hereinafter also referred to as "TFTs") as switching elements, one for each pixel, which is the smallest unit of an image.

A TFT having a typical configuration includes, for example, a gate electrode provided on an insulating substrate, a gate insulating film covering the gate electrode, an island-like semiconductor layer provided on the gate insulating layer over the gate electrode, and a source electrode and a drain electrode provided on the semiconductor layer, facing each other.

The TFT substrate includes a plurality of TFTs provided on a substrate and arranged in a matrix, an insulating film covering the TFTs and having a flat surface, and a plurality of pixel electrodes provided on the insulating film, each corresponding to one of the TFTs. In a liquid crystal display panel, a counter substrate is disposed to face the TFT substrate, and a liquid crystal layer is provided between the TFT substrate and the counter substrate.

In recent years, for the TFT substrate, a TFT including a semiconductor layer of an oxide semiconductor (hereinafter referred to as an oxide semiconductor layer) instead of a semiconductor layer of amorphous silicon (a-Si) has been proposed as a TFT for each pixel, which is the smallest unit of an image. The oxide semiconductor layer is more excellent than the a-Si semiconductor layer in the following respects: better switching characteristics; lower off current value; higher electron mobility; availability of a low-temperature process; etc. In particular, because of the better switching characteristics and the lower off current value, the layout of the TFTs can be caused to be more compact, leading to an increase in aperture ratio. Therefore, a reduction in power consumption and an increase in resolution are expected.

Incidentally, the electrical characteristics of oxide semiconductors are known to depend significantly on the concentration of oxygen. Therefore, for example, when the concentration of oxygen around the oxide semiconductor layer varies due to a thermal treatment, the electrical characteristics of the oxide semiconductor layer disadvantageously degrade.

PATENT DOCUMENT 1 describes an oxide semiconductor TFT which includes a channel protection layer provided above the gate electrode, covering at least a portion of side surfaces of the semiconductor layer exposed from the source and drain electrodes. Here, the source and drain electrodes have, for example, a multilayer structure including a Mo film, an Al film, and a Mo film. PATENT DOCUMENT 1 states that because the channel protection layer is thus provided, even if a thermal treatment for forming a passivation film etc. is performed, a change in the concentration of oxygen contained in the semiconductor layer is reduced or prevented, and therefore, a degradation in electrical characteristics is reduced or prevented. PATENT DOCUMENT 1 also states that if a thermal treatment is performed at as high as 350° C. or more in order to restore the degraded electrical characteristics of the semiconductor layer, the semiconductor layer reacts with the source and drain electrodes, so that hillocks (projections and recesses) disadvantageously occur on the source and drain electrodes, and that even when the thermal treatment for forming a passivation film etc. is performed, the degradation in the electrical characteristics of the semiconductor layer is reduced or prevented, and therefore, the thermal treatment at 350° C. is not performed after the formation of the source and drain electrodes.

CITATION LIST

Patent Document

PATENT DOCUMENT 1: Japanese Patent Publication No. 2010-123748

SUMMARY OF THE INVENTION

Technical Problem

However, even when the channel protection layer is provided as in PATENT DOCUMENT 1, the degradation in the electrical characteristics of the semiconductor layer due to, for example, the thermal treatment for forming a passivation film cannot be completely avoided. Therefore, it is desirable to restore the electrical characteristics of the degraded semiconductor layer by performing an annealing treatment at as high as about 350° C.

It is an object of the present invention to provide a TFT substrate which includes oxide semiconductor TFTs having excellent electrical characteristics, and thereby has lower power consumption and higher resolution.

Solution to the Problem

A thin film transistor substrate according to the present invention includes a substrate, a gate electrode provided on the substrate, a gate insulating film provided on the substrate and covering the gate electrode, an oxide semiconductor layer provided on the gate insulating film and having a channel portion at a position facing the gate electrode, an island-like channel protection layer provided on the oxide semiconductor layer and covering the channel portion, a source electrode and a drain electrode provided on the oxide semiconductor layer and separated from each other with the channel portion and the channel protection layer being interposed between the source and drain electrodes, and an interlayer insulating film provided above the source and drain electrodes. The source and drain electrodes are formed of an aluminum alloy film or a multilayer film including an aluminum alloy film.

In the above configuration, the island-like channel protection layer covers the channel portion of the oxide semiconductor layer, whereby a degradation in the electrical characteristics of the channel portion of the oxide semiconductor layer which is caused due to exposure to high temperature, can be reduced or prevented.

In the above configuration, the source and drain electrodes are formed of an aluminum alloy film or a multilayer film including an aluminum alloy film, whereby the source and drain electrodes have excellent heat resistance. Therefore, even when a thermal treatment is performed at as high as about 350° C. in a step subsequent to the step of forming the source and drain electrodes, it is not likely that hillocks (projections and recesses) occur on surfaces of the source and drain electrodes, or that the oxide semiconductor layer reacts with the source and drain electrodes to degrade the electrical characteristics of the oxide semiconductor layer. Therefore, for example, after the formation of the interlayer insulating film, annealing can be performed at as high as about 350° C. in order to restore the electrical characteristics of the oxide semiconductor layer, whereby the TFT can have excellent electrical characteristics. Because the TFT has excellent electrical characteristics, the layout of the TFTs etc. can be caused to be more compact in the TFT substrate, whereby the aperture ratio can be increased, and in addition, the power consumption can be reduced and the resolution can be increased.

In the thin film transistor substrate of the present invention, the channel protection layer is preferably configured to block light.

In the above configuration, the channel protection layer is configured to block light. Therefore, a change in the electrical characteristics of the oxide semiconductor layer which is caused due to irradiation with light, can be reduced or prevented. Moreover, the channel protection layer has an island-like pattern, and therefore, light is not blocked in a region other than the channel portion of the oxide semiconductor layer. Therefore, a reduction in aperture ratio which is caused by blockage of light to a region other than the channel portion, can be reduced or prevented.

The channel protection layer may have a multilayer structure including a plurality of layers including a light-blocking photosensitive resin layer, or a multilayer structure including a plurality of layers including a light-blocking metal layer.

When the channel protection layer has a multilayer structure including a plurality of layers including a light-blocking photosensitive resin layer, the plurality of layers included in the multilayer structure may be an insulating resin layer, an oxide semiconductor layer provided above the insulating resin layer, and the light-blocking photosensitive resin layer provided above the oxide semiconductor layer.

When the channel protection layer has a multilayer structure including a plurality of layers including a light-blocking metal layer, the plurality of layers included in the multilayer structure may be an insulating resin layer, the light-blocking metal layer provided above the insulating resin layer, and a photosensitive insulating layer provided above the light-blocking metal layer.

In the thin film transistor of the present invention, the aluminum alloy film included in the source and drain electrodes is preferably resistant to heat of 350° C. or more. The aluminum alloy film resistant to heat of 350° C. or more is, for example, an alloy film formed of an alloy including aluminum as a major component and at least one selected from the group consisting of silicon (Si), neodymium (Nd), copper (Cu), nickel (Ni), and lanthanum (La) as a secondary component.

A display device according to the present invention includes the thin film transistor substrate of the present invention, a counter substrate facing the thin film transistor substrate, and a display medium layer provided between the thin film transistor substrate and the counter substrate.

In the display device of the present invention, the display medium layer is preferably a liquid crystal layer.

A thin film transistor substrate manufacturing method according to the present invention is a method for manufacturing a thin film transistor substrate including a substrate, a gate electrode provided on the substrate, a gate insulating film provided on the substrate and covering the gate electrode, an oxide semiconductor layer provided on the gate insulating film and having a channel portion at a position facing the gate electrode, an island-like channel protection layer provided on the oxide semiconductor layer and covering the channel portion, a source electrode and a drain electrode provided on the oxide semiconductor layer and separated from each other with the channel portion and the channel protection layer being interposed between the source and drain electrodes, and an interlayer insulating film provided above the source and drain electrodes. The method includes forming the gate electrode on the substrate, forming the gate insulating film on the gate electrode, forming the oxide semiconductor layer on the gate insulating film, forming the island-like channel protection layer covering the channel portion of the oxide semiconductor layer, forming, on the oxide semiconductor layer and the channel protection layer, the source and drain electrodes of an aluminum alloy film or a multilayer film including an aluminum alloy film, forming the interlayer insulating film on the source and drain electrodes, and after the forming the interlayer insulating film, annealing the interlayer insulating film at 200-350° C.

In the above method, the island-like channel protection layer covers the channel portion of the oxide semiconductor layer. Therefore, a degradation in the electrical characteristics of the channel portion of the oxide semiconductor layer which is caused due to exposure to high temperature, can be reduced or prevented.

In the above method, the source and drain electrodes are formed of an aluminum alloy film or a multilayer film including an aluminum alloy film, and therefore, have excellent heat resistance. Therefore, even when a thermal treatment is performed at as high as about 350° C. in a step subsequent to the step of forming the source and drain electrodes, it is not likely that hillocks (projections and recesses) occur on surfaces of the source and drain electrodes, or that the oxide semiconductor layer reacts with the source and drain electrodes to degrade the electrical characteristics of the oxide semiconductor layer. Therefore, for example, after the formation of the interlayer insulating film, annealing can be performed at as high as about 350° C. in order to restore the electrical characteristics of the oxide semiconductor layer, whereby the TFT can have excellent electrical characteristics. Because the TFT has excellent electrical characteristics, the layout of the TFTs etc. can be caused to be more compact in the TFT substrate, whereby the aperture ratio can be increased, and in addition, the power consumption can be reduced and the resolution can be increased.

In the thin film transistor substrate manufacturing method of the present invention, the channel protection layer is preferably formed of a light-blocking material.

In the above method, the channel protection layer is formed of a light-blocking material. Therefore, a change in the electrical characteristics of the oxide semiconductor layer which is caused due to irradiation with light, can be reduced or prevented. Moreover, the channel protection layer has an island-like pattern, and therefore, light is not blocked in a region other than the channel portion of the oxide semiconductor layer. Therefore, a reduction in aperture ratio which is caused by blockage of light to a region other than the channel portion, can be reduced or prevented.

In the thin film transistor substrate manufacturing method of the present invention, the channel protection layer may be formed by forming, on top of one another, a plurality of layers including a light-blocking photosensitive resin layer or by forming, on top of one another, a plurality of layers including a light-blocking metal layer.

When the channel protection layer is formed by forming, on top of one another, a plurality of layers including a light-blocking photosensitive resin layer, the plurality of layers formed as the channel protection layer may be an insulating resin layer, an oxide semiconductor layer provided above the insulating resin layer, and the light-blocking photosensitive resin layer provided above the oxide semiconductor layer.

When the channel protection layer is formed by forming, on top of one another, a plurality of layers including a light-blocking metal layer, the plurality of layers formed as the channel protection layer may be an insulating resin layer, the light-blocking metal layer provided above the insulating resin layer, and a photosensitive insulating layer provided above the light-blocking metal layer.

In the thin film transistor substrate manufacturing method of the present invention, the aluminum alloy film included in the source and drain electrodes is preferably resistant to heat of 350° C. or more. The aluminum alloy film resistant to heat of 350° C. or more is, for example, an alloy film formed of an alloy including aluminum as a major component and at least one selected from the group consisting of silicon (Si), neodymium (Nd), copper (Cu), nickel (Ni), and lanthanum (La) as a secondary component.

Advantages of the Invention

According to the present invention, the island-like channel protection layer covers the channel portion of the oxide semiconductor layer. Therefore, a degradation in the electrical characteristics of the channel portion of the oxide semiconductor layer which is caused due to exposure to high temperature, can be reduced or prevented. According to the present invention, the source and drain electrodes are formed of an aluminum alloy film or a multilayer film including an aluminum alloy film, whereby the source and drain electrodes have excellent heat resistance. Therefore, even when a thermal treatment is performed at as high as about 350° C. in a step subsequent to the step of forming the source and drain electrodes, it is not likely that hillocks (projections and recesses) occur on surfaces of the source and drain electrodes, or that the oxide semiconductor layer reacts with the source and drain electrodes to degrade the electrical characteristics of the oxide semiconductor layer. Therefore, for example, after the formation of the interlayer insulating film, annealing can be performed at as high as about 350° C. in order to restore the electrical characteristics of the oxide semiconductor layer, whereby the TFT can have excellent electrical characteristics. Because the TFT has excellent electrical characteristics, the layout of the TFTs etc. can be caused to be more compact in the TFT substrate, whereby the aperture ratio can be increased, and in addition, the power consumption can be reduced and the resolution can be increased.

BRIEF DESCRIPTION OF THE DRAWINGS

FIGS. 13(a) and 13(b) are diagrams for describing the method for manufacturing the TFT substrate of the second embodiment.

DESCRIPTION OF EMBODIMENTS

Embodiments of the present invention will be described in detail below with reference to the accompanying drawings. Note that the present invention is not limited to the embodiments below.

First Embodiment

Configuration of Liquid Crystal Display Device

—TFT Substrate—

Figure 1:
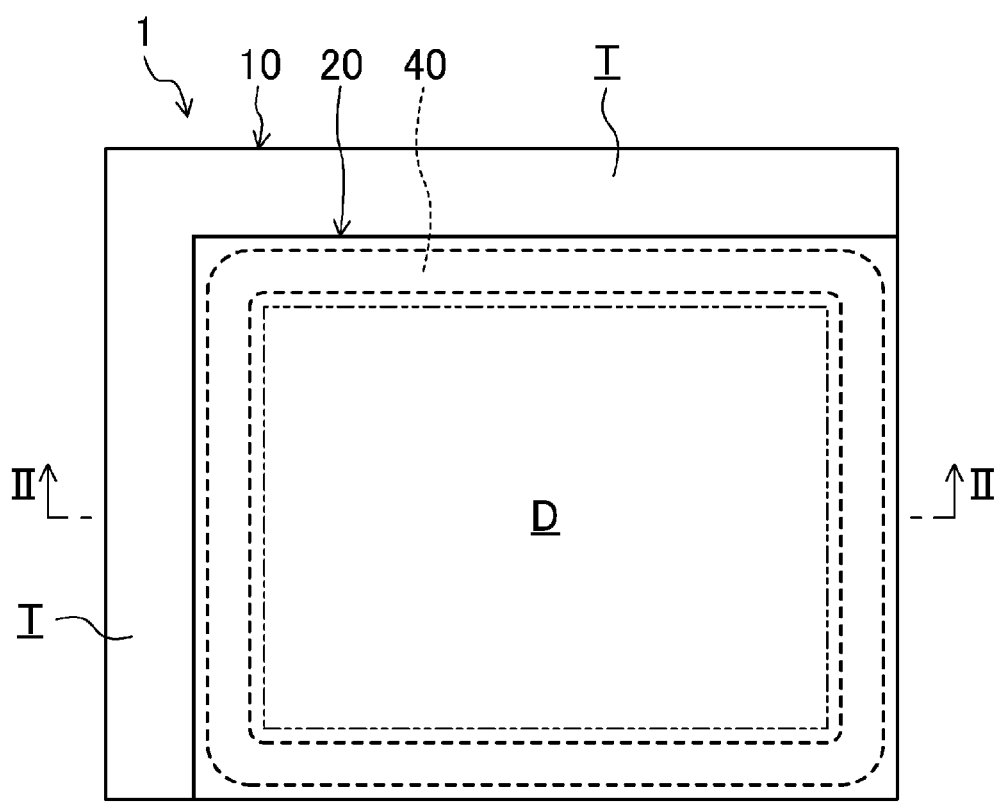
FIG. 1 is a schematic plan view of a liquid crystal display device.
Figure 2:
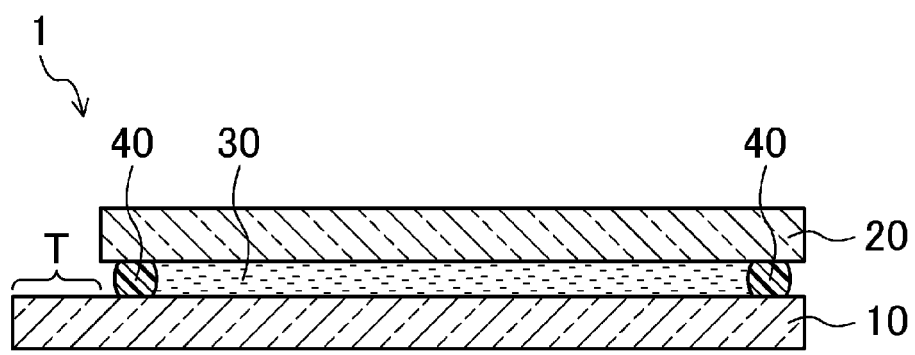
FIG. 2 is a cross-sectional view taken along line II-II of FIG. 1.
Figure 3:
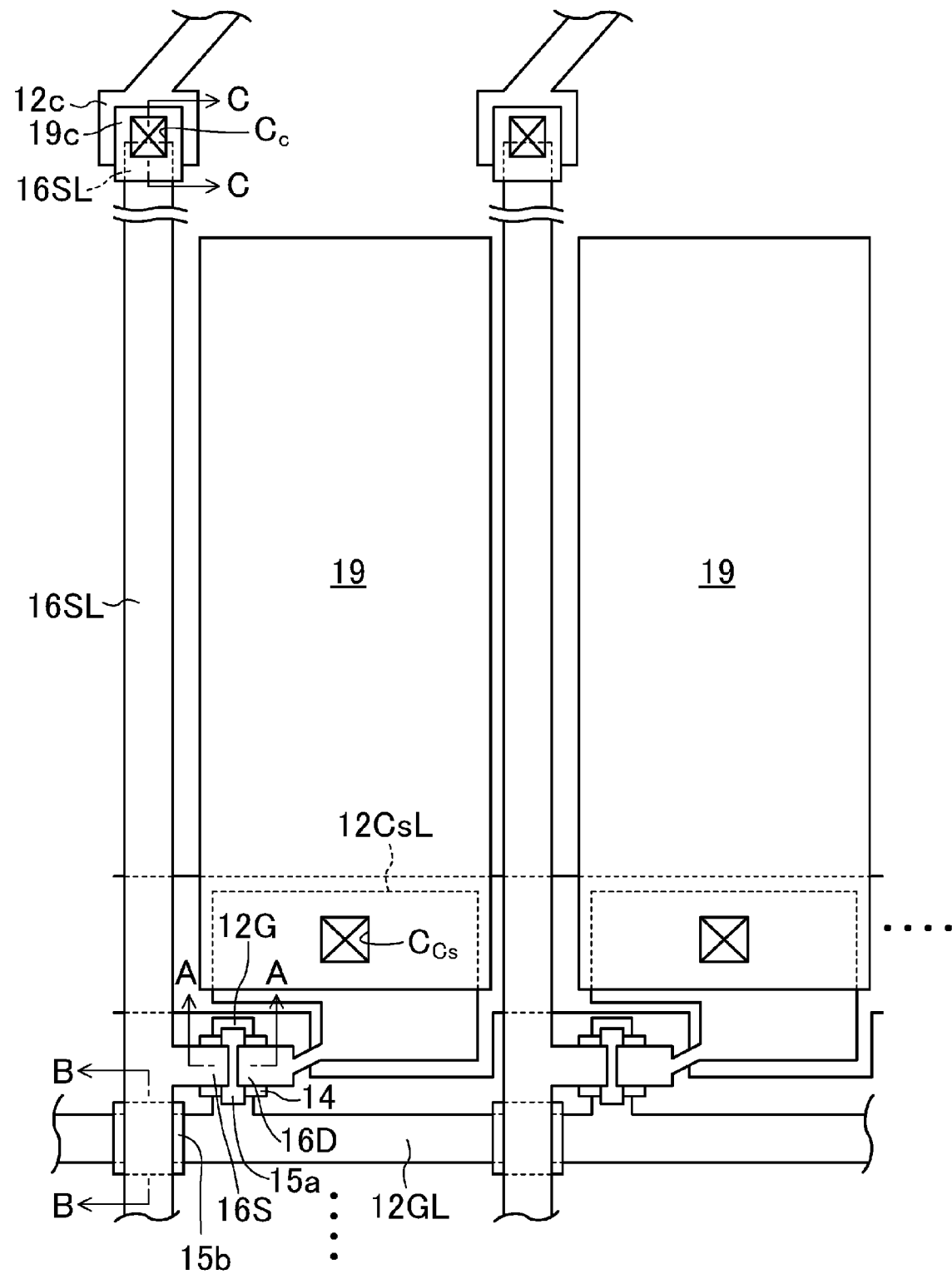
FIG. 3 is an enlarged plan view of a main portion of a TFT substrate.
Figure 4:
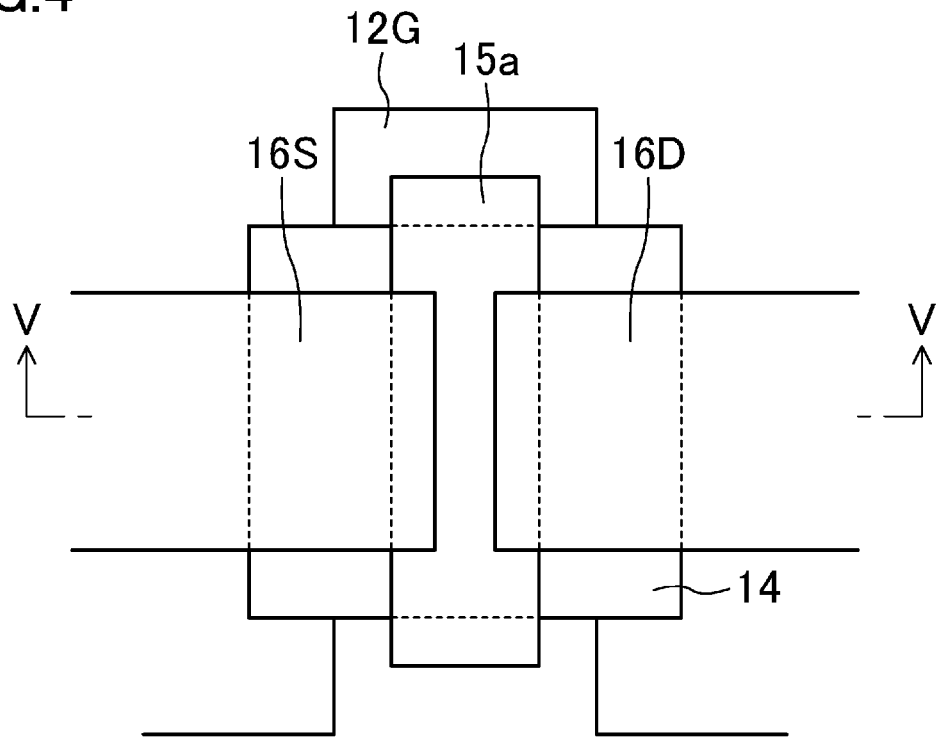
FIG. 4 is an enlarged plan view of a TFT according to a first embodiment.
Figure 5:
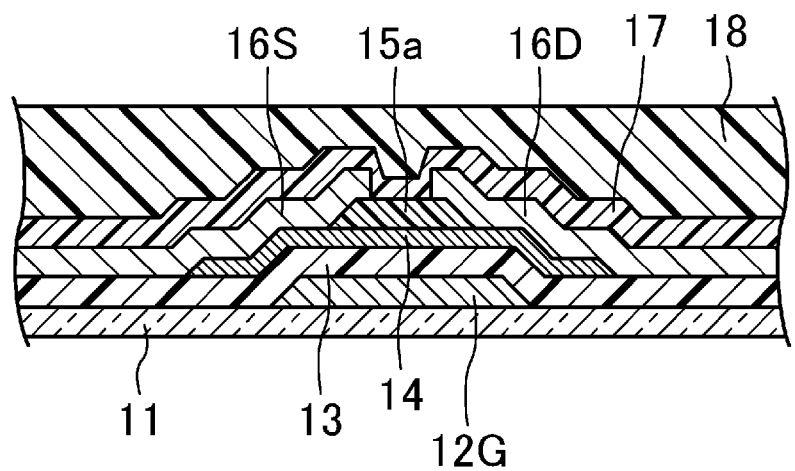
FIG. 5 is a cross-sectional view taken along line V-V of FIG. 4.

FIG. 1 is a plan view of a liquid crystal display device 1 having a TFT substrate 10 including thin film transistors according to a first embodiment. FIG. 2 is a cross-sectional view taken along line II-II of FIG. 1. FIG. 3 is an enlarged plan view of a display region D of the TFT substrate 10 including the TFTs of this embodiment. FIG. 4 is an enlarged plan view of the TFT in the display region D of the TFT substrate 10. FIG. 5 is a cross-sectional view of the TFT, taken along line V-V of FIG. 4.

In the liquid crystal display device 1, the TFT substrate 10 and a counter substrate 20 are disposed to face each other, and are bonded together by a sealing member 40 provided at an outer circumferential portion of the substrates. A liquid crystal layer 30 is provided as a display medium layer in a region surrounded by the sealing member 40.

In the liquid crystal display device 1, the display region D in which an image is displayed is formed on an inner side of the sealing member 40, and a terminal region T is formed in a region of the TFT substrate 10 which protrudes beyond the counter substrate 20.

As shown in FIG. 3, the TFT substrate 10 includes, in the display region D, a plurality of gate signal lines 12GL extending in parallel to each other, a plurality of source signal lines 16SL extending in parallel to each other in a direction perpendicular to the gate signal lines 12GL, and a plurality of TFTs each provided for a corresponding one of intersection portions of the gate signal lines 12GL and the source signal lines 16SL, i.e., one TFT for each pixel. Note that a plurality of storage capacitor lines 12CsL extending in parallel to each other are each provided between the corresponding gate signal lines 12GL.

The TFT substrate 10 has, on a substrate 11, a multilayer structure including: a conductive film including gate electrodes 12G, the gate signal lines 12GL, etc.; an insulating film including a gate insulating film 13, an oxide semiconductor layer 14, a channel protection layer 15a, and a gate protection layer 15b; a conductive film including source electrodes 16S, drain electrodes 16D, the source signal lines 16SL, etc.; an interlayer insulating film including a passivation film 17 and a planarization film 18; pixel electrodes; and an alignment film.

As shown in FIGS. 4 and 5, in the TFT, the gate electrode 12G which protrudes from the gate signal line 12GL is provided, and the oxide semiconductor layer 14 is provided above the gate electrode 12G with the gate insulating film 13 covering the gate electrode 12G being interposed therebetween. Note that a portion of the oxide semiconductor layer 14 which faces the gate electrode 12G forms a channel portion. The channel portion is covered by the island-like channel protection layer 15a provided thereabove. The source electrode 16S and the drain electrode 16D are provided above the oxide semiconductor layer 14, and are separated from each other with the channel portion being interposed therebetween. The passivation film 17 and the planarization film 18 are provided one on top of the other as an interlayer insulating film, covering the above elements.

The gate electrode 12G is formed of a known material, such as a multilayer film including a Ti film (thickness: about 1-10 nm), an Al film (thickness: about 50-400 nm), and a Ti film (thickness: about 50-300 nm).

The gate insulating film 13 is formed of a known material, such as a $SiO_2$ film having a thickness of about 20-100 nm.

The oxide semiconductor layer 14 is formed of, for example, an In—Ga—Zn—O (IGZO) metal oxide, and has a thickness of, for example, about 20-200 nm. In—Ga—Zn—O (IGZO) metal oxides are amorphous but have a high mobility, and therefore, can confer satisfactory characteristics, such as a high mobility and a low off current, to a thin film transistor. Although, here, the oxide semiconductor layer 14 is formed of an In—Ga—Zn—O (IGZO) metal oxide, the oxide semiconductor layer 14 may be formed of, for example, a metal oxide containing any one of In, Ga, and Zn. These metal oxides are amorphous but have a high mobility, and therefore, can be used to form a thin film transistor having a high on current.

The channel protection layer 15a is formed of, for example, an insulating material, such as a $SiO_2$ film etc. The channel protection layer is formed in an island-like pattern by patterning to cover the channel portion corresponding to the channel region of the oxide semiconductor layer 14. Because the channel protection layer 15a covers the channel portion of the oxide semiconductor layer 14, direct heating of the channel portion in a thermal treatment step is reduced or prevented, whereby a degradation in the electrical characteristics of the oxide semiconductor layer 14 which is caused due to a reduction in the resistance of the channel portion, is reduced or prevented. The channel protection layer 15a has a thickness of, for example, about 50-400 nm.

The source electrode 16S and the drain electrode 16D are formed of a multilayer film including an Al alloy film. Specifically, the source electrode 16S and the drain electrode 16D are formed of a multilayer film including a Ti film, an Al alloy film, and a Ti film. A material which has a low specific resistance and is resistant to heat of 350° C. or more is suitable for the Al alloy film. An example of such a material is an alloy containing Al as a major component and at least one selected from the group consisting of silicon (Si), neodymium (Nd), copper (Cu), nickel (Ni), and lanthanum (La) as a secondary component (i.e., such an alloy may be Al—Si, Al—Nd, Al—Cu, Al—Ni, or Al—La). Alternatively, in addition to the above multilayer film, the source electrode 16S and the drain electrode 16D may be formed of, for example, a multilayer film including a Mo film, an Al alloy film, and a Mo film. Alternatively, in addition to the multilayer film including an Al alloy film, the source electrode 16S and the drain electrode 16D may be formed of a single-layer film including an Al alloy film.

The passivation film 17 is formed of a known material, such as a $SiO_2$ film having a thickness of about 50-500 nm. The planarization film 18 is formed of a known material, such as a photosensitive resin etc. The passivation film 17 and the planarization film 18 are each formed as an interlayer insulating film, and may be integrated into an interlayer insulating film.

The pixel electrode 19 is formed of a known material, such as an ITO film having a thickness of about 20-300 nm.

—Counter Substrate—

Although not shown, the counter substrate 20 includes, on a substrate, a color filter layer including a light-blocking layer and a color layer, a common electrode covering the color filter layer, and an alignment film covering the common electrode.

—Liquid Crystal Layer—

The liquid crystal layer 30 is formed of, for example, a nematic liquid crystal material which has electro-optic properties.

—Operation of Liquid Crystal Display Device—

In each pixel of the liquid crystal display device 1 thus configured, when a gate signal is transferred from a gate driver through the gate signal line 12GL to the gate electrode 12G, so that the TFT in the display region D is turned on, in the TFT a source signal is transferred from a source driver through the source signal line 16SL to the source electrode 16S, so that predetermined charge is written through the oxide semiconductor layer 14 and the drain electrode 16D to the pixel electrode 19. At this time, a potential difference occurs between the pixel electrode 19 of the TFT substrate 10 and the common electrode of the counter substrate 20, and therefore, a predetermined voltage is applied to the liquid crystal layer 30, i.e., the liquid crystal capacitor of the pixel, and a storage capacitor element connected in parallel to the liquid crystal capacitor. In the liquid crystal display device 1, the light transmittance of the liquid crystal layer 30 is adjusted in each pixel by changing the magnitude of a voltage applied to the liquid crystal layer 30 and thereby changing the alignment of the liquid crystal layer 30, whereby an image is displayed.

(Method for Manufacturing TFT Substrate)

A method for manufacturing the TFT substrate 10 according to this embodiment will be described below with reference to FIGS. 6 and 7.

—Formation of First Conductive Film—Gate Insulating Film—

Figure 6A:
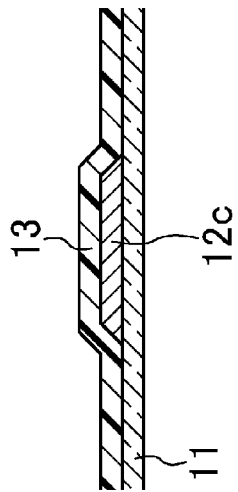
FIGS. 6(a)-6(c) are diagrams for describing a method for manufacturing the TFT substrate of the first embodiment.

Initially, on the substrate 11, for example, a Ti film (thickness: about 1-10 nm), an Al film (thickness: about 50-400 nm), and a Ti film (thickness: about 50-300 nm) are successively formed on top of one another to form a first conductive film. Thereafter, patterning is performed to form the gate electrodes 12G, the gate signal lines 12GL, the storage capacitor lines 12CsL, lead lines 12c, etc. After the patterning of the first conductive film, as shown in FIG. 6(a) a SiN film having a thickness of about 100-500 nm and a $SiO_2$ film having a thickness of about 20-100 nm are formed one on top of the other to form the gate insulating film 13 above the gate electrodes 12G, the gate signal lines 12GL, the storage capacitor lines 12CsL, the lead lines 12c, etc.

—Formation of Oxide Semiconductor Layer—

Figure 6B:
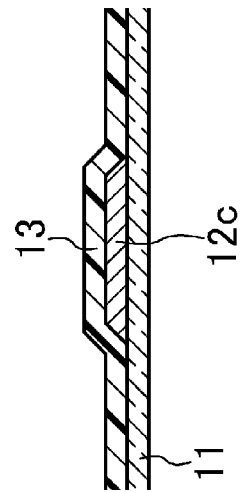

Next, an oxide semiconductor film having a thickness of, for example, about 20-200 nm is formed, and then patterned to form the oxide semiconductor layer 14, corresponding to regions where the TFTs are to be formed, as shown in FIG. 6(b).

Note that, in this case, the oxide semiconductor film may be patterned so that the oxide semiconductor film is also provided in regions of the storage capacitor elements.

—Formation of Channel Protection Layer—

Figure 6C:
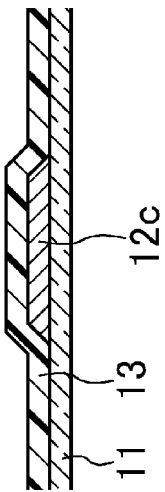

Next, a $SiO_2$ film having a thickness of, for example, about 50-400 nm is formed and then patterned to form the channel protection layer 15a and the gate protection layer 15b as shown in FIG. 6(c). After the formation of the channel protection layer 15a and the gate protection layer 15b, annealing is performed, for example, in the atmosphere at 200-350° C. for 0.5-10 h.

—Formation of Second Conductive Film—

Figure 7A:
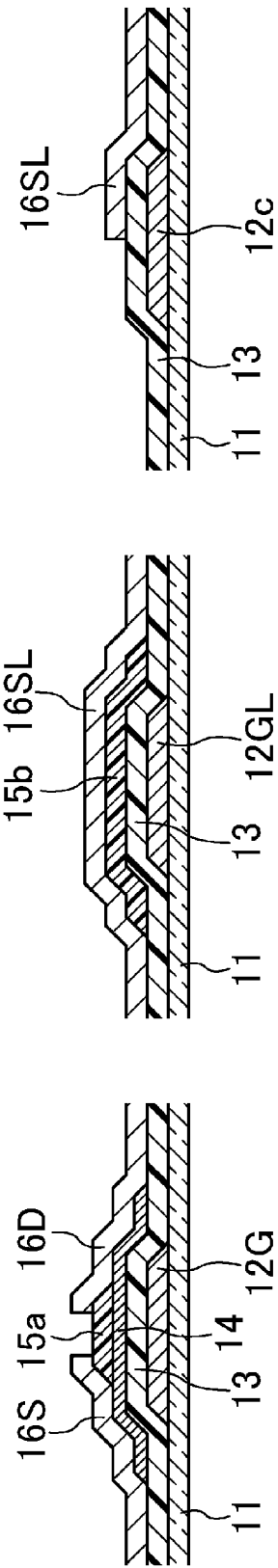
FIGS. 7(a) and 7(b) are diagrams for describing the method for manufacturing the TFT substrate of the first embodiment.

Next, for example, a Ti film (thickness: about 1-10 nm), an Al film (thickness: about 50-400 nm), and a Ti film (thickness: about 50-300 nm) are successively formed on top of one another to form a second conductive film. Thereafter, as shown in FIG. 7(a), the second conductive film is patterned to form the source electrodes 16S, the drain electrodes 16D, and the source signal lines 16SL.

—Formation of Interlayer Insulating Film—

Figure 7B:
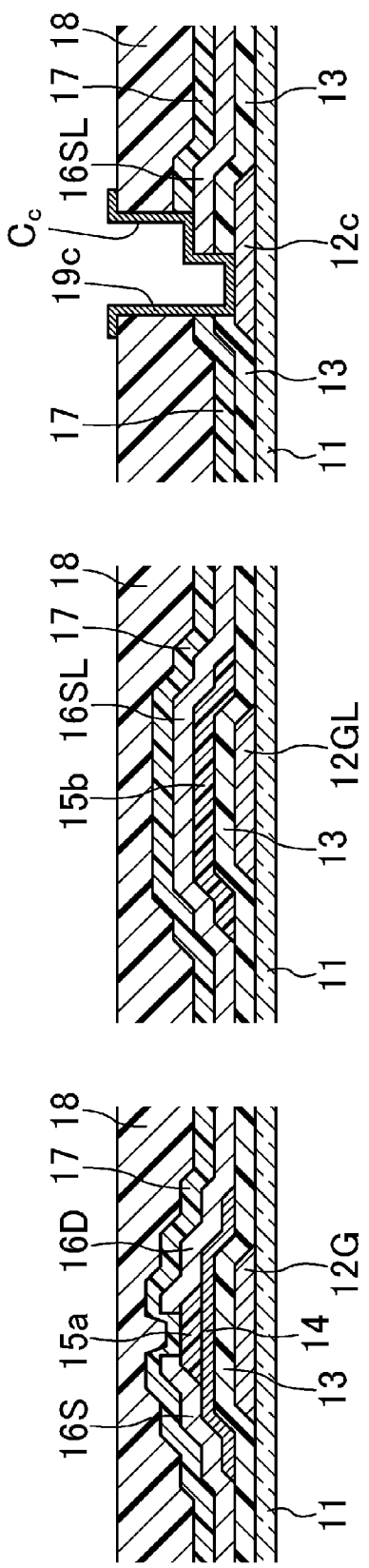

Next, as shown in FIG. 7(b), for example, a $SiO_2$ film having a thickness of about 50-500 nm is formed as the passivation film 17 on the entire substrate 11. Thereafter, annealing is performed, for example, in the atmosphere at 200-350° C. for 0.5-10 h.

Next, for example, a photosensitive resin film is formed as the planarization film 18. Thereafter, the photosensitive resin film is exposed and developed, and then decolorized. Thereafter, baking is performed, for example, in the atmosphere at 200-250° C. for 0.5-5 h.

—Formation of Third Conductive Film—

Next, a contact hole CCs which extends from a surface of the planarization film 18 to the drain electrode 16D is formed in each of the regions of the storage capacitor elements. A contact hole Cc which exposes the source signal line 16SL and the lead line 12c on the surface is formed in each gate-source contact portion.

Next, for example, an ITO film having a thickness of about 20-300 nm is formed as the third conductive film. Thereafter, patterning is performed on regions of the third conductive film which cover the pixel electrodes 19 and the contact holes Cc of the gate-source contact portions. After the formation of the pixel electrodes 19 etc., baking is performed, for example, in the atmosphere at 200-250° C. for 0.5-5 h.

Finally, the alignment film (not shown) is formed to cover the display region D. Thus, the TFT substrate 10 is produced.

For example, the TFT substrate 10 is bonded, by the sealing member 40, to the counter substrate 20 which has been separately formed using a known technique, and the liquid crystal layer 30 is provided between the two substrates, whereby the liquid crystal display device 1 can be formed.

Advantages of First Embodiment

In the above configuration, the island-like channel protection layer 15a covers the channel portion of the oxide semiconductor layer 14. Therefore, a degradation in the electrical characteristics of the channel portion of the oxide semiconductor layer 14 which is caused due to exposure to high temperature, can be reduced or prevented.

In the above configuration, the source electrode 16S and the drain electrode 16D are formed of a multilayer film including an aluminum alloy film, and therefore, have excellent heat resistance. Therefore, even when a thermal treatment is performed at as high as about 350° C. in a step subsequent to the step of forming the source electrode 16S and the drain electrode 16D, it is not likely that hillocks (projections and recesses) occur on surfaces of the source electrode 16S and the drain electrode 16D, or that the oxide semiconductor layer 14 reacts with the source electrode 16S and the drain electrode 16D to degrade the electrical characteristics of the oxide semiconductor layer 14. Therefore, for example, after the formation of the passivation film 17, annealing can be performed at as high as about 350° C. in order to restore the electrical characteristics of the oxide semiconductor layer 14, whereby the TFT can have excellent electrical characteristics. Because the TFT has excellent electrical characteristics, the layout of the TFTs etc. can be caused to be more compact in the TFT substrate 10, whereby the aperture ratio can be increased, and in addition, the power consumption can be reduced and the resolution can be increased.

As described above, the TFT substrate 10 of this embodiment has excellent electrical characteristics, and can be quickly charged because of high switching characteristics, leading to a higher frame rate. Therefore, the TFT substrate 10 of this embodiment is suitable for a liquid crystal panel for a 3D display.

The TFT substrate 10 of this embodiment has excellent electrical characteristics, high switching characteristics, and a low off current, and therefore, intermittent driving can be performed, resulting in a reduction in power consumption. Therefore, the TFT substrate 10 of this embodiment is suitable for a liquid crystal panel for an electronic book.

In the foregoing description, the gate protection film 15b is provided at the intersection portion of the gate signal line 12GL and the source signal line 16SL. Alternatively, the gate protection film 15b may not be provided.

In the foregoing description, the TFT is provided, corresponding to each pixel in the display region D. Alternatively, the TFT having the above configuration may be provided in the terminal region T. Even when the TFT of this embodiment is provided in the terminal region T, the excellent electrical characteristics of the TFT allow for a reduction in power consumption and an increase in resolution. In this case, the higher resolution of the TFTs in the terminal region T allows for a reduction in the area of the frame region. Therefore, this TFT substrate is suitable for a liquid crystal panel for a mobile device.

EXAMPLES

Figure 17:
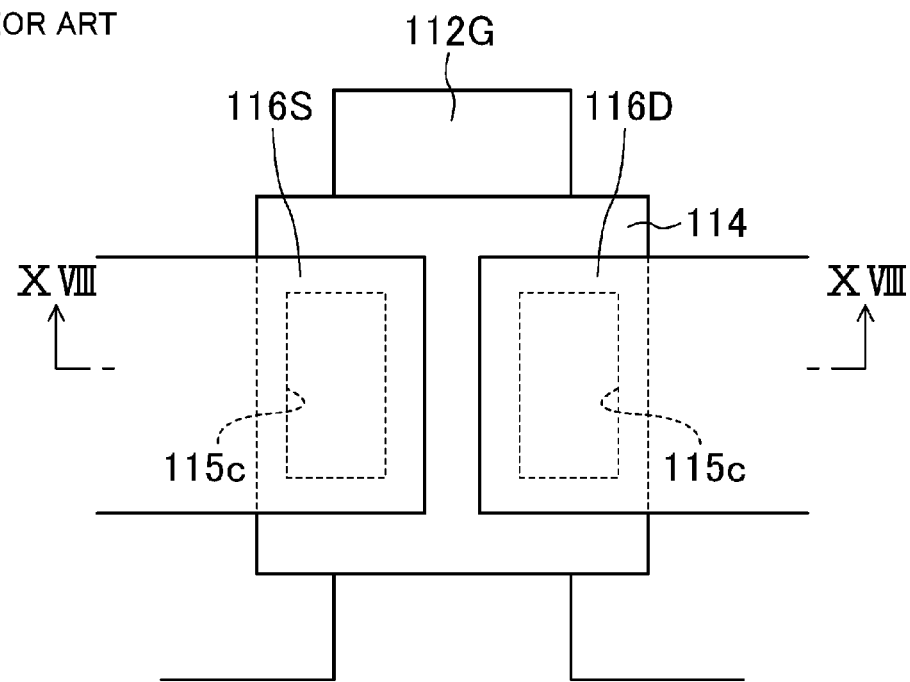
FIG. 17 is an enlarged plan view of a TFT having a conventional configuration.
Figure 18:
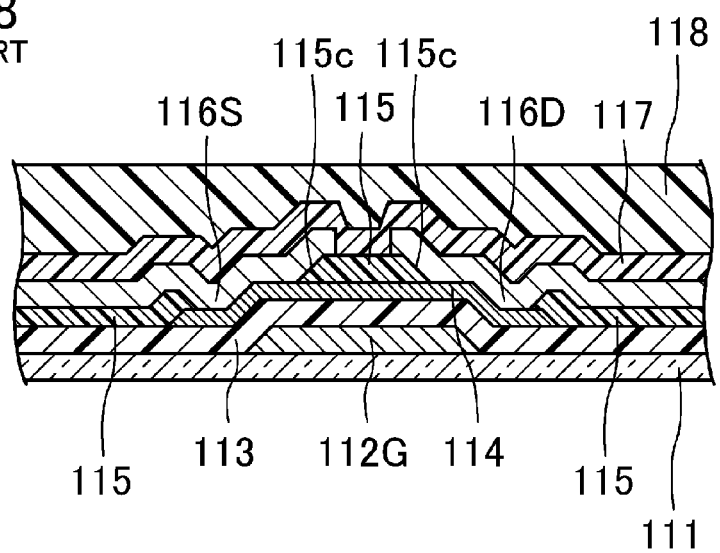
FIG. 18 is a cross-sectional view taken along line XVIII-XVIII of FIG. 17.

A TFT (example) having the configuration of the first embodiment shown in FIGS. 4 and 5 and a TFT having a conventional configuration shown in FIGS. 17 and 18 were measured to assess the electrical characteristics thereof. The subthreshold swing value (S value) is used as a parameter which quantitatively represents the electrical characteristics of a TFT. The S value is the change rate of the drain current with respect to the gate voltage in a region where the gate voltage is lower than or equal to the threshold voltage. The S value can be determined by measuring the slope $(S=\Delta Id/\Delta Vg)$ of the Id-Vg characteristics of the TFT.

Figure 8:
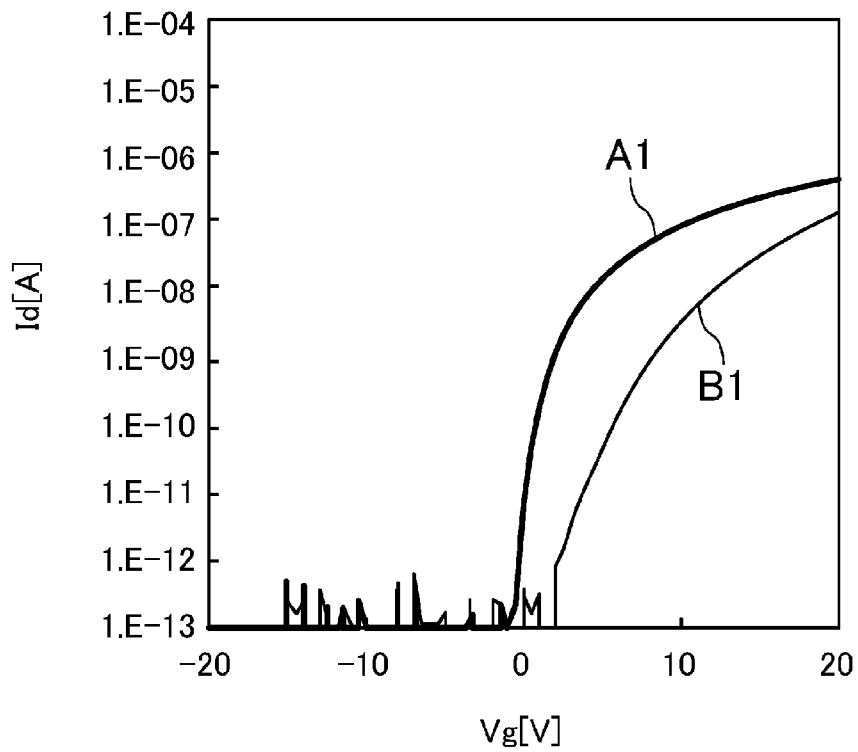
FIG. 8 is a graph of a relationship between the gate voltage and the drain current of a TFT in each of an example (A1) and a comparative example (B1).

FIG. 8 shows a relationship between the gate voltage and the drain current in TFTs of an example (A1) and a comparative example (B1). As can be seen from the graph, the TFT of the example A1 has a smaller S value, i.e., more excellent electrical characteristics, than that of the TFT of the comparative example B1.

Figure 9:
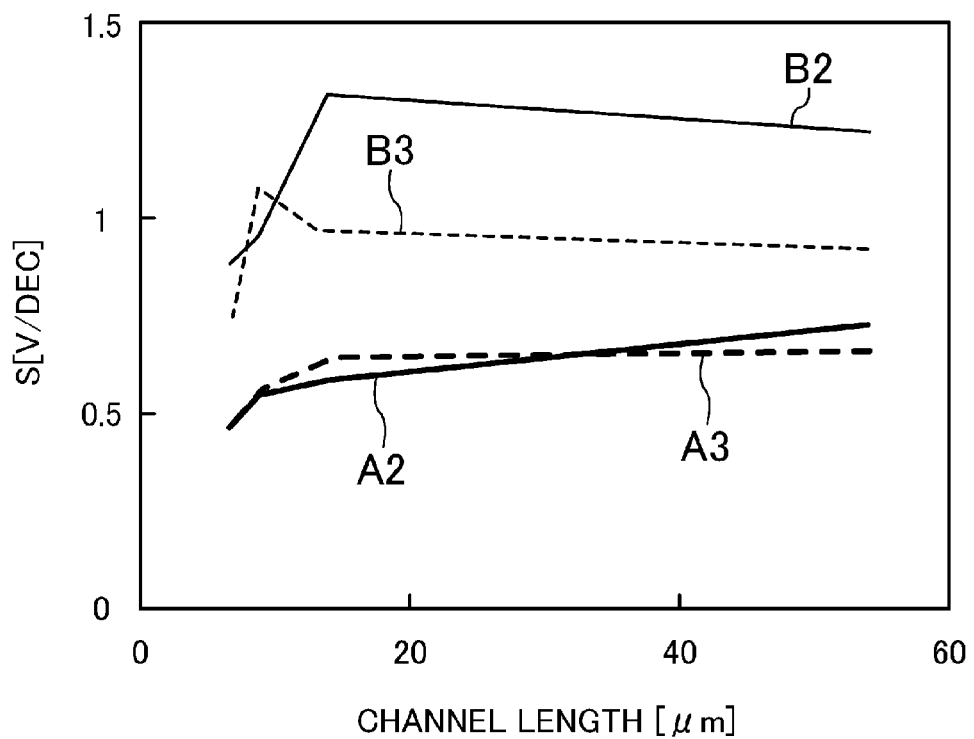
FIG. 9 is a graph of a relationship between the channel length and the S value of a TFT according to each of examples (A2 and A3) and comparative examples (B2 and B3).

FIG. 9 is a graph showing a relationship between the channel length (7-54 μm) and the S value of TFTs of examples (A2 and A3) and comparative examples (B2 and B3). Here, the TFT of the example A2 has a channel width of 9 μm. The TFT of the example A3 has a channel width of 24 μm. The TFT of the comparative example B2 has a channel width of 5 μm. The TFT of the comparative example B3 has a channel width of 20 μm. As can be seen from the graph, the TFTs of the examples A2 and A3 have a smaller S value, i.e., more excellent electrical characteristics, than those of the TFTs of the comparative examples B2 and B3, irrespective of the magnitude of the channel length or channel width.

Second Embodiment

Next, a liquid crystal display device according to a second embodiment will be described.
—TFT Substrate—
As in the first embodiment, in the liquid crystal display device 1, a TFT substrate 10 and a counter substrate 20 are disposed to face each other, and are bonded together by a sealing member 40 provided at an outer circumferential portion of the substrates. A liquid crystal layer 30 is provided as a display medium layer in a region surrounded by the sealing member 40.

In the liquid crystal display device 1, a display region D in which an image is displayed is formed on an inner side of the sealing member 40, and a terminal region T is formed in a region of the TFT substrate 10 which protrudes beyond the counter substrate 20.

Figure 10:
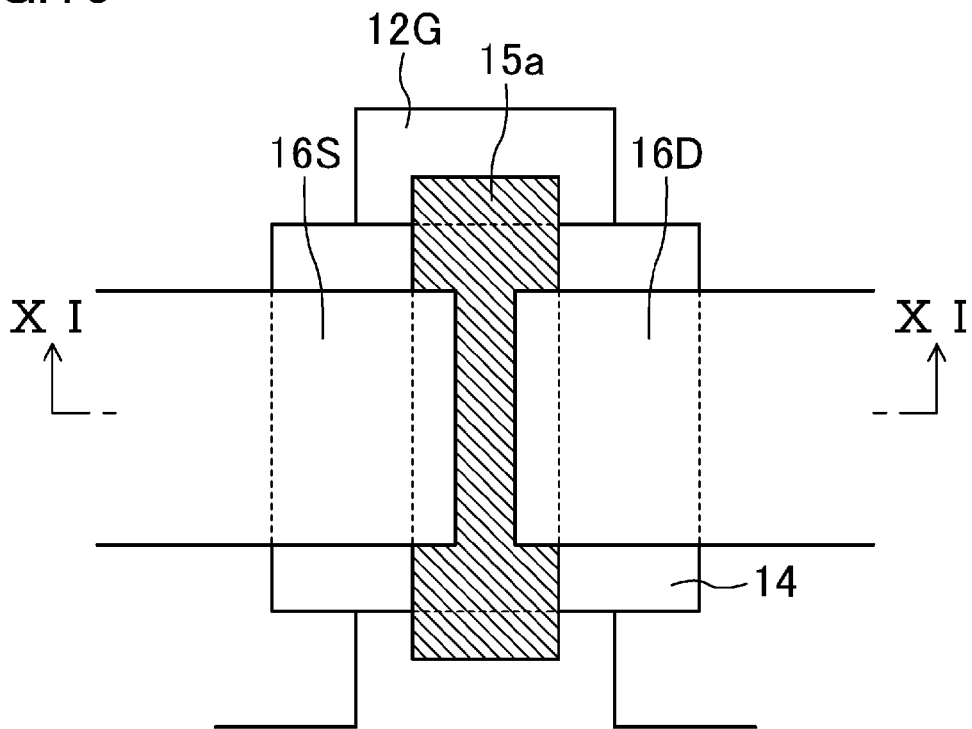
FIG. 10 is an enlarged plan view of a TFT according to a second embodiment.

As shown in FIG. 10, the TFT substrate 10 includes, in the display region D, a plurality of gate signal lines 12GL extending in parallel to each other, a plurality of source signal lines 16SL extending in parallel to each other in a direction perpendicular to the gate signal lines 12GL, and a plurality of TFTs each provided for a corresponding one of intersection portions of the gate signal lines 12GL and the source signal lines 16SL, i.e., one TFT for each pixel. Note that a plurality of storage capacitor lines 12CsL extending in parallel to each other are each provided between the corresponding gate signal lines 12GL.

The TFT substrate 10 has, on a substrate 11, a multilayer structure including: a conductive film including gate electrodes 12G, the gate signal lines 12GL, etc.; an insulating film including a gate insulating film 13, an oxide semiconductor layer 14, a channel protection layer 15a, and a gate protection layer 15b; a conductive film including source electrodes 16S, drain electrodes 16D, the source signal lines 16SL, etc.; an interlayer insulating film including a passivation film 17 and a planarization film 18; pixel electrodes 19; and an alignment film.

Figure 11:
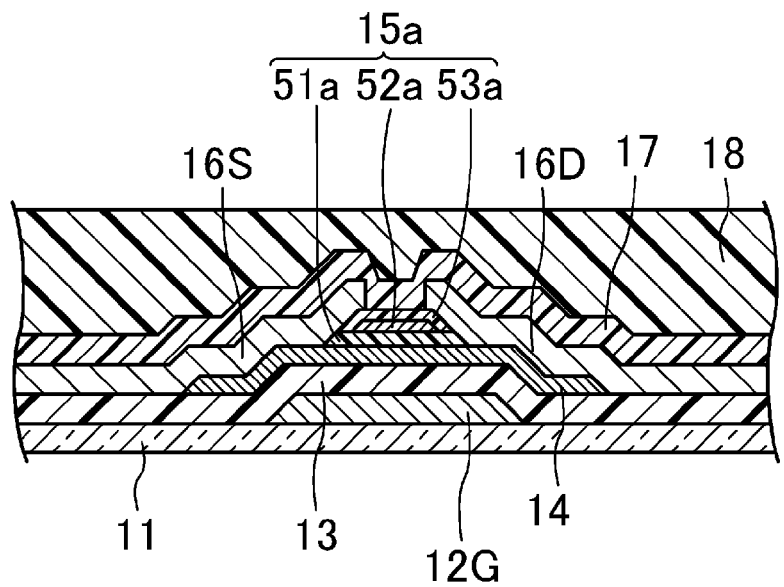
FIG. 11 is a cross-section view taken along line XI-XI of FIG. 10.

As shown in FIGS. 10 and 11, in the TFT, the gate electrode 12G which protrudes from the gate signal line 12GL is provided, and the oxide semiconductor layer 14 is provided above the gate electrode 12G with the gate insulating film 13 covering the gate electrode 12G being interposed therebetween. Note that a portion of the oxide semiconductor layer 14 which faces the gate electrode 12G forms a channel portion. The channel portion is covered by the island-like channel protection layer 15a provided thereabove. The source electrode 16S and the drain electrode 16D are provided above the oxide semiconductor layer 14, and are separated from each other with the channel portion being interposed therebetween. The passivation film 17 and the planarization film 18 are provided one on top of the other as an interlayer insulating film, covering the above elements.

The gate electrode 12G is formed of a known material, such as a multilayer film including a Ti film (thickness: about 1-10 nm), an Al film (thickness: about 50-400 nm), and a Ti film (thickness: about 50-300 nm).

The gate insulating film 13 is formed of a known material, such as a $SiO_2$ film having a thickness of about 20-100 nm.

The oxide semiconductor layer 14 is formed of, for example, an In—Ga—Zn—O (IGZO) metal oxide, and has a thickness of, for example, about 20-200 nm. In—Ga—Zn—O (IGZO) metal oxides are amorphous but have a high mobility, and therefore, can confer satisfactory characteristics, such as a high mobility and a low off current, to a thin film transistor. Although, here, the oxide semiconductor layer 14 is formed of an In—Ga—Zn—O (IGZO) metal oxide, the oxide semiconductor layer 14 may be formed of, for example, a metal oxide containing any one of In, Ga, and Zn. These metal oxides are amorphous but have a high mobility, and therefore, can be used to form a thin film transistor having a high on current.

The channel protection layer 15a has a multilayer structure including a plurality of layers. The channel protection layer 15a includes an insulating resin layer 51a, an oxide semiconductor layer 52a, and a light-blocking photosensitive resin layer 53a which are successively formed on top of one another (the insulating resin layer 51a is the lowest), and the resulting overall structure can block light. The channel protection layer 15a is formed in an island-like pattern by patterning to cover the channel portion corresponding to the channel region of the oxide semiconductor layer 14. Because the channel protection layer 15a covers the channel portion of the oxide semiconductor layer 14, direct heating of the channel portion in a thermal treatment step is reduced or prevented, whereby a degradation in the electrical characteristics of the oxide semiconductor layer 14 which is caused due to a reduction in the resistance of the channel portion, is reduced or prevented.

The layers included in the channel protection layer 15a are formed as follows. The insulating resin layer 51a is formed of, for example, a $SiO_2$ film having a thickness of about 10-500 nm. The oxide semiconductor layer 52a is formed of, for example, an In—Ga—Zn—O (IGZO) metal oxide film having a thickness of about 10-200 nm. The light-blocking photosensitive resin layer 53a is formed of, for example, a pigment-dispersed negative photoresist for formation of a black matrix (e.g., the "CFPR BK" series manufactured by TOKYO OHKA KOGYO, CO., LTD., etc.) having a thickness of about 100-3000 nm.

The source electrode 16S and the drain electrode 16D are formed of a multilayer film including an Al alloy film. Specifically, the source electrode 16S and the drain electrode 16D are formed of a multilayer film including a Ti film, an Al alloy film, and a Ti film. A material which has a low specific resistance and is resistant to heat of 350° C. or more is suitable for the Al alloy film. An example of such a material is an alloy containing Al as a major component and at least one selected from the group consisting of silicon (Si), neodymium (Nd), copper (Cu), nickel (Ni), and lanthanum (La) as a secondary component (i.e., such an alloy may be Al—Si, Al—Nd, Al—Cu, Al—Ni, or Al—La). Alternatively, in addition to the above multilayer film, the source electrode 16S and the drain electrode 16D may be formed of, for example, a multilayer film including a Mo film, an Al alloy film, and a Mo film.

Alternatively, in addition to the multilayer film including an Al alloy film, the source electrode 16S and the drain electrode 16D may be formed of a single-layer film including an Al alloy film.

The passivation film 17 is formed of a known material, such as a SiO$_2$ film having a thickness of about 50-500 nm. The planarization film 18 is formed of a known material, such as a photosensitive resin etc. The passivation film 17 and the planarization film 18 are each formed as an interlayer insulating film, and may be integrated into an interlayer insulating film.

The pixel electrode 19 is formed of a known material, such as an ITO film having a thickness of about 20-300 nm.

—Counter Substrate—

Although not shown, the counter substrate 20 includes, on a substrate, a color filter layer including a light-blocking layer and a color layer, a common electrode covering the color filter layer, and an alignment film covering the common electrode.

—Liquid Crystal Layer—

The liquid crystal layer 30 is formed of, for example, a nematic liquid crystal material which has electro-optic properties.

—Operation of Liquid Crystal Display Device—

In each pixel of the liquid crystal display device 1 thus configured, when a gate signal is transferred from a gate driver through the gate signal line 12GL to the gate electrode 12G, so that the TFT in the display region D is turned on, in the TFT a source signal is transferred from a source driver through the source signal line 16SL to the source electrode 16S, so that predetermined charge is written through the oxide semiconductor layer 14 and the drain electrode 16D to the pixel electrode 19. At this time, a potential difference occurs between the pixel electrode 19 of the TFT substrate 10 and the common electrode of the counter substrate 20, and therefore, a predetermined voltage is applied to the liquid crystal layer 30, i.e., the liquid crystal capacitor of the pixel, and a storage capacitor element connected in parallel to the liquid crystal capacitor. In the liquid crystal display device 1, the light transmittance of the liquid crystal layer 30 is adjusted in each pixel by changing the magnitude of a voltage applied to the liquid crystal layer 30 and thereby changing the alignment of the liquid crystal layer 30, whereby an image is displayed.

(Method for Manufacturing TFT Substrate)

A method for manufacturing the TFT substrate 10 according to this embodiment will be described below with reference to FIGS. 12 and 13.

—Formation of First Conductive Film—Gate Insulating Film—

Figure 12A:
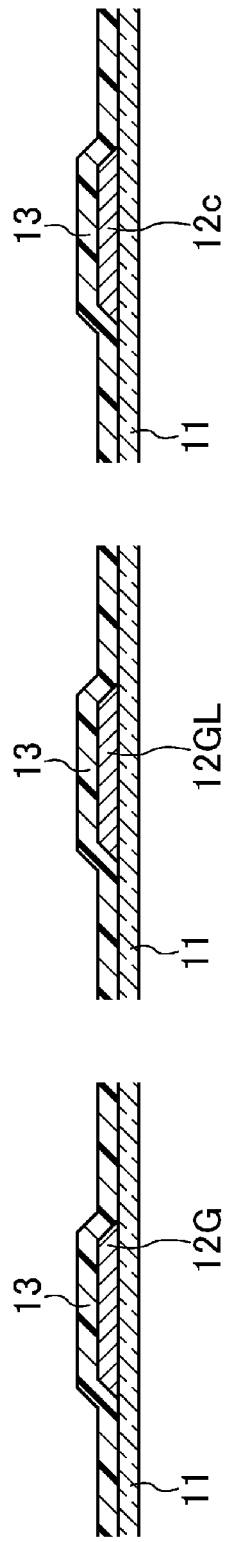
FIGS. 12(a)-12(c) are diagrams for describing a method for manufacturing a TFT substrate according to the second embodiment.

Initially, on the substrate 11, for example, a Ti film (thickness: about 1-10 nm), an Al film (thickness: about 50-400 nm), and a Ti film (thickness: about 50-300 nm) are successively formed on top of one another to form a first conductive film. Thereafter, patterning is performed to form the gate electrodes 12G, the gate signal lines 12GL, the storage capacitor lines 12CsL, lead lines 12c, etc. After the patterning of the first conductive film, as shown in FIG. 12(a) a SiN film having a thickness of about 100-500 nm and a SiO$_2$ film having a thickness of about 20-100 nm are formed one on top of the other to form the gate insulating film 13 above the gate electrodes 12G, the gate signal lines 12GL, the storage capacitor lines 12CsL, the lead lines 12c, etc.

—Formation of Oxide Semiconductor Layer—

Figure 12B:
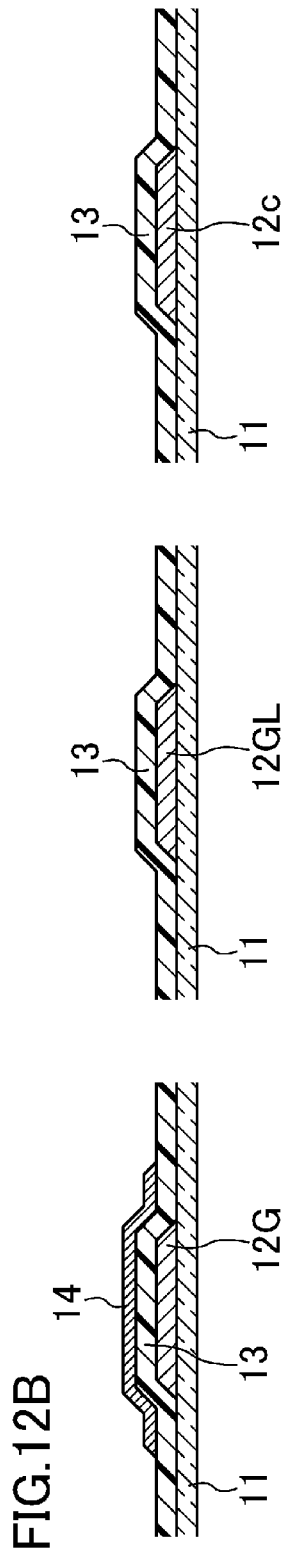

Next, an oxide semiconductor film having a thickness of, for example, about 20-200 nm is formed, and then patterned to form the oxide semiconductor layer 14, corresponding to regions where the TFTs are to be formed, as shown in FIG. 12(b).

Note that, in this case, the oxide semiconductor film may be patterned so that the oxide semiconductor film is also provided in regions of the storage capacitor elements.

—Formation of Channel Protection Layer—

Figure 12C:
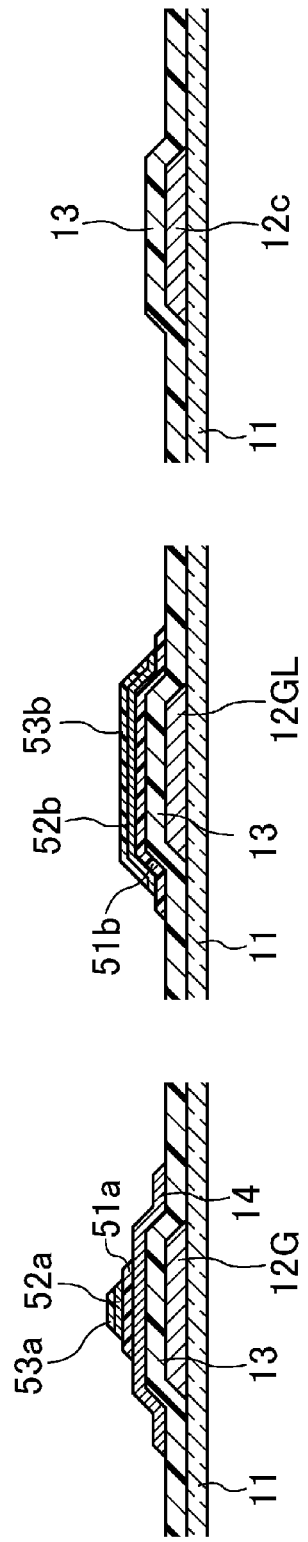

Next, a SiO$_2$ film, an oxide semiconductor film, and a light-blocking photosensitive resin film are successively formed. Thereafter, the light-blocking photosensitive resin film is patterned to form the light-blocking photosensitive resin layers 53a and 53b corresponding to the channel protection layer 15a and the gate protection layer 15b. Thereafter, as shown in FIG. 12(c), the oxide semiconductor film is wet etched using the light-blocking photosensitive resin layers 53a and 53b as a mask to form the oxide semiconductor layers 52a and 52b, and thereafter, the SiO$_2$ film is etched to form the insulating resin layers 51a and 51b. Thereafter, as shown in FIG. 13(a), the light-blocking photosensitive resin layer 53a is cured by a thermal treatment so that the light-blocking photosensitive resin layers 53a and 53b are allowed to reflow to cover the oxide semiconductor layers 52a and 52b.

—Formation of Second Conductive Film—

Next, for example, a Ti film (thickness: about 1-10 nm), an Al film (thickness: about 50-400 nm), and a Ti film (thickness: about 50-300 nm) are successively formed on top of one another to form a second conductive film. Thereafter, as shown in FIG. 13(b), the second conductive film is patterned to form the source electrodes 16S, the drain electrodes 16D, and the source signal lines 16SL.

—Formation of Interlayer Insulating Film—

Next, as shown in FIG. 13(b), for example, a SiO$_2$ film having a thickness of about 50-500 nm is formed as the passivation film 17 on the entire substrate 11. Thereafter, annealing is performed, for example, in the atmosphere at 200-350° C. for 0.5-10 h.

Next, for example, a photosensitive resin film is formed as the planarization film 18. Thereafter, the photosensitive resin film is exposed and developed, and then decolorized. Thereafter, baking is performed, for example, in the atmosphere at 200-250° C. for 0.5-5 h.

—Formation of Third Conductive Film—

Next, a contact hole CCs which extends from a surface of the planarization film 18 to the drain electrode 16D is formed in each of the regions of the storage capacitor elements. A contact hole Cc which exposes the source signal line 16SL and the lead line 12c on the surface is formed in each gate-source contact portion.

Next, for example, an ITO film having a thickness of about 20-300 nm is formed as the third conductive film. Thereafter, patterning is performed on regions of the third conductive film which cover the pixel electrodes 19 and the contact holes Cc of the gate-source contact portions. After the formation of the pixel electrodes 19 etc., baking is performed, for example, in the atmosphere at 200-250° C. for 0.5-5 h.

Finally, the alignment film (not shown) is formed to cover the display region D. Thus, the TFT substrate 10 is produced.

For example, the TFT substrate 10 is bonded, by the sealing member 40, to the counter substrate 20 which has been separately formed using a known technique, and the liquid crystal layer 30 is provided between the two substrates, whereby the liquid crystal display device 1 can be formed.

Advantages of Second Embodiment

In the above configuration, the island-like channel protection layer 15a covers the channel portion of the oxide semiconductor layer 14. Therefore, a degradation in the electrical characteristics of the channel portion of the oxide semiconductor layer 14 which is caused due to exposure to high temperature, can be reduced or prevented.

In the above configuration, the source electrode 16S and the drain electrode 16D are formed of a multilayer film including an aluminum alloy film. Therefore, the source electrode 16S and the drain electrode 16D have excellent heat resistance. Therefore, even when a thermal treatment is performed at as high as about 350° C. in a step subsequent to the step of forming the source electrode 16S and the drain electrode 16D, it is not likely that hillocks (projections and recesses) occur on surfaces of the source electrode 16S and the drain electrode 16D, or that the oxide semiconductor layer 14 reacts with the source electrode 16S and the drain electrode 16D to degrade the electrical characteristics of the oxide semiconductor layer 14. Therefore, for example, after the formation of the passivation film 17, annealing can be performed at as high as about 350° C. in order to restore the electrical characteristics of the oxide semiconductor layer 14, whereby the TFT can have excellent electrical characteristics. Because the TFT has excellent electrical characteristics, the layout of the TFTs etc. can be caused to be more compact in the TFT substrate 10, whereby the aperture ratio can be increased, and in addition, the power consumption can be reduced and the resolution can be increased.

As described above, the TFT substrate 10 of this embodiment has excellent electrical characteristics, and can be quickly charged because of high switching characteristics, leading to a higher frame rate. Therefore, the TFT substrate 10 of this embodiment is suitable for a liquid crystal panel for a 3D display.

The TFT substrate 10 of this embodiment has excellent electrical characteristics, high switching characteristics, and a low off current, and therefore, intermittent driving can be performed, resulting in a reduction in power consumption. Therefore, the TFT substrate 10 of this embodiment is suitable for a liquid crystal panel for an electronic book.

In the foregoing description, the gate protection film 15b is provided at the intersection portion of the gate signal line 12GL and the source signal line 16SL. Alternatively, the gate protection film 15b may not be provided.

In the foregoing description, the TFT is provided, corresponding to each pixel in the display region D. Alternatively, the TFT having the above configuration may be provided in the terminal region T. Even when the TFT of this embodiment is provided in the terminal region T, the excellent electrical characteristics of the TFT allow for a reduction in power consumption and an increase in resolution. In this case, the higher resolution of the TFTs in the terminal region T allows for a reduction in the area of the frame region. Therefore, the TFT substrate is suitable for a liquid crystal panel for a mobile device.

In the above configuration, the channel protection layer 15a is configured to block light. Therefore, a change in the electrical characteristics of the oxide semiconductor layer 14 which is caused due to irradiation with light, can be reduced or prevented. Moreover, the channel protection layer 15a has an island-like pattern, and therefore, light is not blocked in a region other than the channel portion of the oxide semiconductor layer 14. Therefore, a reduction in aperture ratio which is caused by blockage of light to a region other than the channel portion, can be reduced or prevented.

In the foregoing description, the TFT is provided, corresponding to each pixel in the display region D. Alternatively, the TFT having the above configuration may be provided in the terminal region T. Even when the TFT of this embodiment is provided in the terminal region T, the excellent electrical characteristics of the TFT allow for a reduction in power consumption and an increase in resolution.

Variation of Second Embodiment

In the TFT substrate of the second embodiment, the channel protection layer 15a has a multilayer structure including the insulating resin layer 51a, the oxide semiconductor layer 52a, and the light-blocking photosensitive resin layer 53a, and is therefore configured to block light. Alternatively, the channel protection layer 15a may have another configuration to block light. A variation of the second embodiment will be described below in which the channel protection layer 15a has a configuration different from that of the second embodiment.

Figure 14:
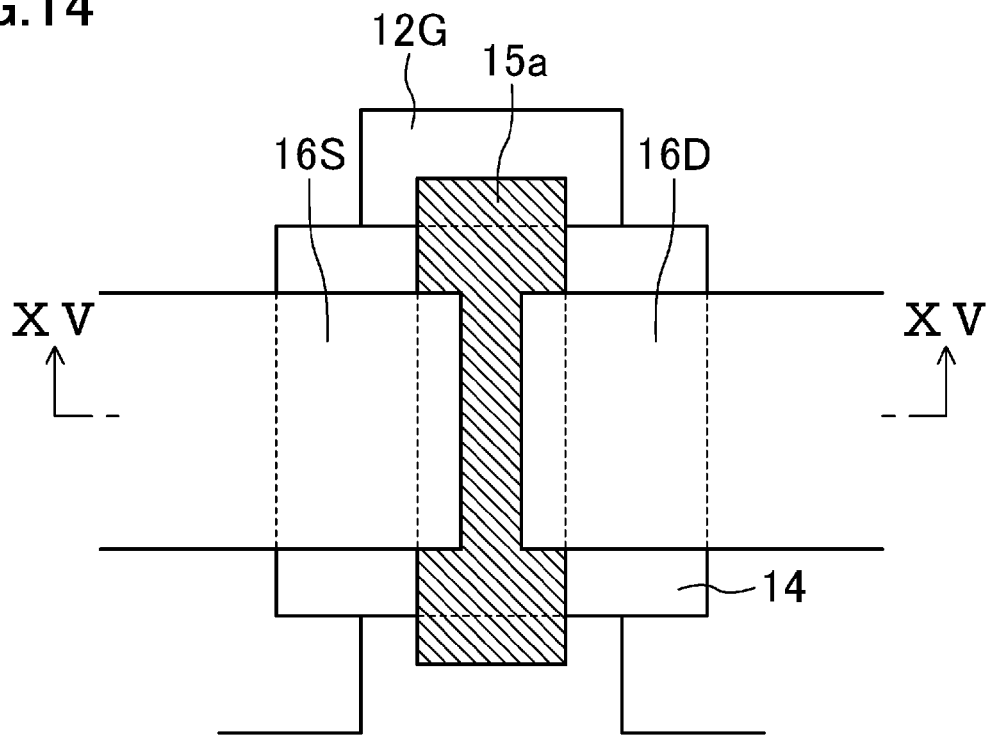
FIG. 14 is an enlarged plan view of a TFT according to a variation of the second embodiment.
Figure 15:
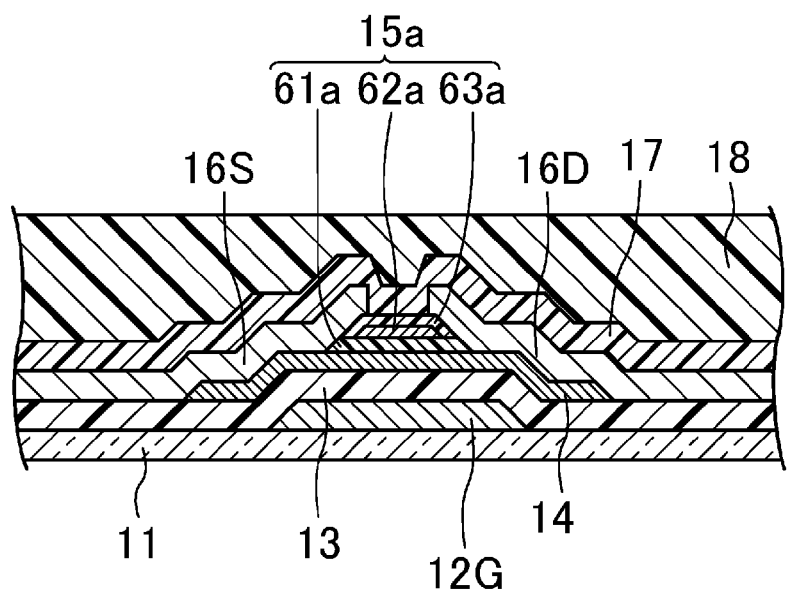
FIG. 15 is a cross-sectional view taken aling line XV-XV of FIG. 14.

FIGS. 14 and 15 show a TFT according to the variation of the second embodiment. The TFT has the same configuration as that of the second embodiment, except for the configuration of the channel protection layer 15a. The channel protection layer 15a has a multilayer structure including a plurality of layers. The channel protection layer 15a includes an insulating resin layer 61a, a light-blocking metal layer 62a, and a photosensitive insulating layer 63a which are successively provided on top of one another (the insulating resin film 61a is the lowest), and the resulting overall structure can block light. The channel protection layer 15a is formed in an island-like pattern by patterning to cover the channel portion corresponding to the channel region of the oxide semiconductor layer 14. Because the channel protection layer 15a covers the channel portion of the oxide semiconductor layer 14, direct heating of the channel portion in a thermal treatment step is reduced or prevented, whereby a degradation in the electrical characteristics of the oxide semiconductor layer 14 which is caused due to a reduction in the resistance of the channel portion, is reduced or prevented.

The layers included in the channel protection layer 15a are formed as follows. The insulating resin layer 61a is formed of, for example, a $SiO_2$ film having a thickness of about 10-500 nm. The light-blocking metal layer 62a is formed of, for example, a metal film (e.g., an Al film, a Mo film, a W film, a Ta film, a Ti film, etc.), an alloy film containing these metals as major components, etc., and has a thickness of, for example, about 40-200 nm. The photosensitive insulating film 63a is formed of, for example, a heat resistant, transparent, photosensitive protection film (e.g., the "OPTMER PC" series manufactured by JSR Corporation, etc.) etc., and has a thickness of, for example, about 100-3000 nm.

Figure 16:
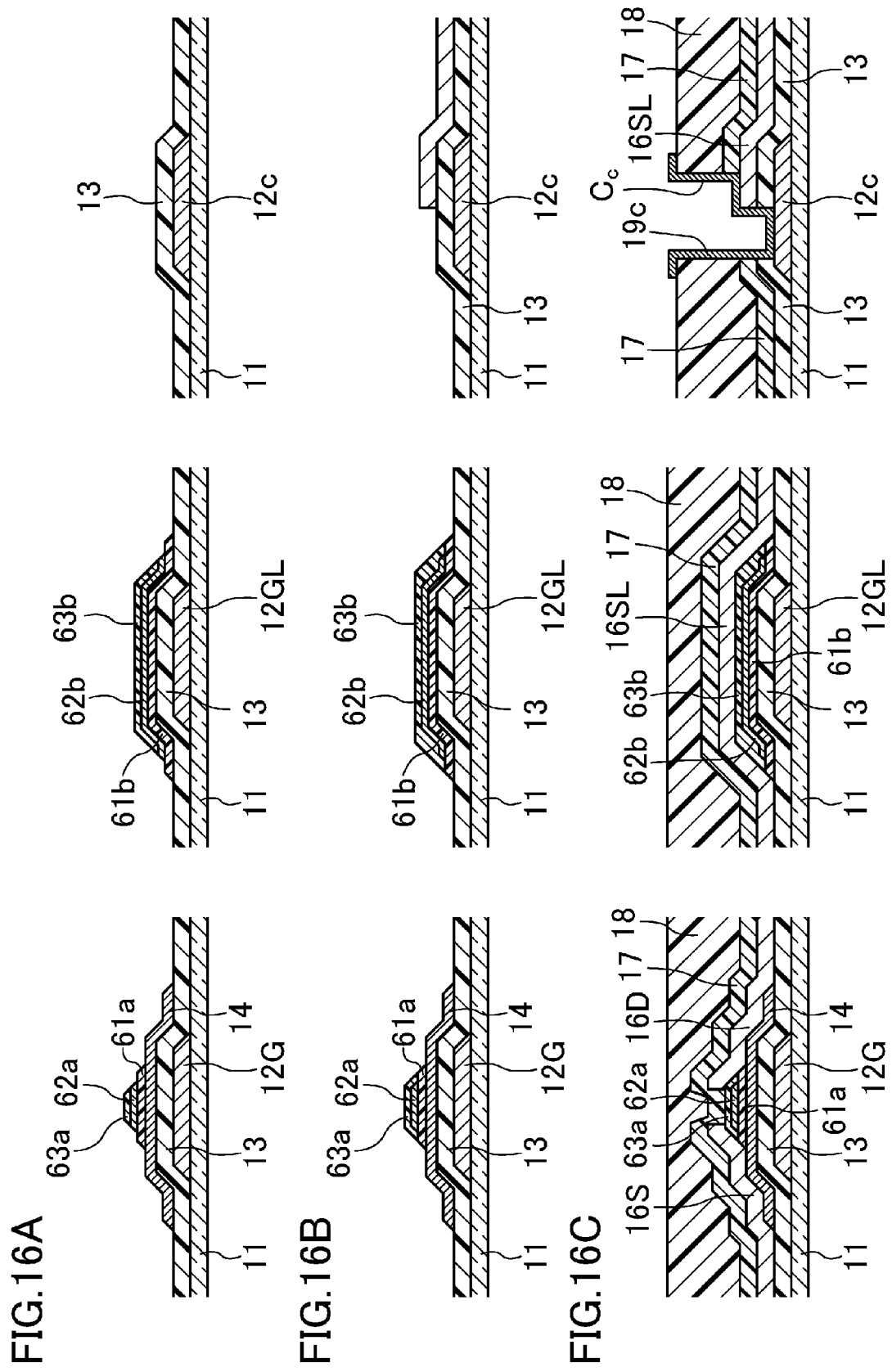
FIGS. 16(a)-16(c) are diagrams for describing a method for manufacturing a TFT substrate according to a variation of the second embodiment.

The channel protection layer 15a is produced as follows. A $SiO_2$ film, a light-blocking metal film, and a photosensitive insulating film are successively formed. Thereafter, the photosensitive insulating film is patterned to form the photosensitive insulating layers 63a and 63b corresponding to the channel protection layer 15a and the gate protection layer 15b. Thereafter, as shown in FIG. 16(a), the oxide semiconductor film is wet etched using the photosensitive insulating layers 63a and 63b as a mask to form the light-blocking metal layers 62a and 62b, and thereafter, the $SiO_2$ film is etched to form the insulating resin layers 61a and 61b. Thereafter, as shown in FIG. 16(b), the light-blocking photosensitive insulating layer 63a is cured by a thermal treatment so that the photosensitive insulating layers 63a and 63b are allowed to reflow to cover the light-blocking metal layers 62a and 62b.

Similar to the TFT of the second embodiment, the channel protection layer 15a is configured to block light. Therefore, a change in the electrical characteristics of the oxide semiconductor layer 14 which is caused due to irradiation with light, can be reduced or prevented.

INDUSTRIAL APPLICABILITY

The present invention is useful for TFT substrates including TFTs including an oxide semiconductor layer, display devices, and methods for manufacturing such TFT substrates.

DESCRIPTION OF REFERENCE CHARACTERS

1 LIQUID CRYSTAL DISPLAY DEVICE
10 TFT SUBSTRATE
11 SUBSTRATE
12G GATE ELECTRODE
13 GATE INSULATING FILM
14 OXIDE SEMICONDUCTOR LAYER
15a CHANNEL PROTECTION LAYER
16S SOURCE ELECTRODE
16D DRAIN ELECTRODE
17 PASSIVATION FILM (INTERLAYER INSULATING FILM)
18 PLANARIZATION FILM (INTERLAYER INSULATING FILM)
51a INSULATING RESIN LAYER
52a OXIDE SEMICONDUCTOR LAYER
53a LIGHT-BLOCKING PHOTOSENSITIVE RESIN LAYER
61a INSULATING RESIN LAYER
62a LIGHT-BLOCKING METAL LAYER
63a PHOTOSENSITIVE INSULATING LAYER

The invention claimed is:

1. A thin film transistor substrate, comprising:
a substrate;
a gate electrode provided on the substrate;
a gate insulating film provided on the substrate and covering the gate electrode;
an oxide semiconductor layer provided on the gate insulating film and having a channel portion at a position facing the gate electrode;
an island-like channel protection layer provided on the oxide semiconductor layer and covering the channel portion;
a source electrode and a drain electrode provided on the oxide semiconductor layer and separated form each other with the channel portion and the channel protection layer being interposed between the source and drain electrodes; and
an interlayer insulating film provided above the source and drain electrodes, wherein
the source and drain electrodes are formed of an aluminum alloy film or a multilayer film including an aluminum alloy film,
the aluminum alloy film included in the source and drain electrodes is resistant to heat of 350° C. or more, and
the aluminum alloy film is formed of an alloy including aluminum as a major component and at least one selected from the group consisting of silicon (Si), neodymium (Nd), copper (Cu), nickel (Ni), and lanthanum (La) as a secondary component.

2. The thin film transistor substrate of claim 1, wherein the channel protection layer is configured to block light.

3. The thin film transistor substrate of claim 2, wherein the channel protection layer has a multilayer structure including a plurality of layers including a light-blocking photosensitive resin layer.

4. The thin film transistor substrate of claim 3, wherein the plurality of layers included in the multilayer structure are an insulating resin layer, an oxide semiconductor layer provided above the insulating resin layer, and the light-blocking photosensitive resin layer provided above the oxide semiconductor layer.

5. A display device comprising the thin film transistor substrate of claim 1, a counter substrate facing the thin film transistor substrate, and a display medium layer provided between the thin film transistor substrate and the counter substrate.

6. The display device of claim 5, wherein the display medium layer is a liquid crystal layer.

7. The thin film transistor substrate of claim 1, wherein the oxide semiconductor layer is made of an In—Ga—Zn—O metal oxide.

8. A thin film transistor substrate, comprising:
a substrate;
a gate electrode provided on the substrate;
a gate insulating film provided on the substrate and covering the gate electrode;
an oxide semiconductor layer provided on the gate insulating film and having a channel portion at a position facing the gate electrode;
an island-like channel protection layer provided on the oxide semiconductor layer and covering the channel portion;
a source electrode and a drain electrode provided on the oxide semiconductor layer and separated from each other with the channel portion and the channel protection layer being interposed between the source and drain electrodes; and
an interlayer insulating film provided above the source and drain electrodes, wherein
the source and drain electrodes are formed of an aluminum alloy film or a multilayer film including an aluminum alloy film,
the channel protection layer has a multilayer structure including a plurality of layers including a light-blocking photosensitive resin layer, and
the channel protection layer has a multilayer structure including a plurality of layers including a light-blocking metal layer.

9. The thin film transistor substrate of claim 8, wherein the plurality of layers included in the multilayer structure are an insulating resin layer, the light-blocking metal layer provided above the insulating resin layer, and a photosensitive insulating layer provided above the light-blocking metal layer.

10. The thin film transistor substrate of claim 8, wherein the aluminum alloy film included in the source and drain electrodes is resistant to heat of 350° C. or more.

11. A display device comprising the thin film transistor substrate of claim 8, a counter substrate facing the thin film transistor substrate, and a display medium layer provided between the thin film transistor substrate and the counter substrate.

12. The display device of claim 11, wherein the display medium layer is a liquid crystal layer.

13. The thin film transistor substrate of claim 8, wherein the oxide semiconductor layer is made of an In—Ga—Zn—O metal oxide.

14. The thin film transistor substrate of claim 8, wherein the aluminum alloy film is formed of an alloy including aluminum as a major component and at least one selected from the group consisting of silicon (Si), neodymium (Nd), copper (Cu), nickel (Ni), and lanthanum (La) as a secondary component.

15. A method for manufacturing a thin film transistor substrate including a substrate, a gate electrode provided on the substrate, a gate insulating film provided on the substrate and covering the gate electrode, an oxide semiconductor layer provided on the gate insulating film and having a channel portion at a semiconductor layer and covering the channel portion, a source electrode and a drain electrode provided on the oxide semiconductor layer and separated from each other with the channel portion and the channel protection layer being interposed between the source and drain electrodes, and an interlayer insulating film provided above the source and drain electrodes, the method comprising:

forming the gate electrode on the substrate;
forming the gate insulating film on the gate electrode;
forming the oxide semiconductor layer on the gate insulating film;
forming the island-like channel protection layer covering the channel portion of the oxide semiconductor layer;
forming, on the oxide semiconductor layer and the channel protection layer, the source and drain electrodes of an aluminum alloy film or a multilayer film including an aluminum alloy film;
forming the interlayer insulating film on the source and drain electrodes; and
after the forming the interlayer insulating film, annealing the interlayer insulating film at 200-350° C., wherein
the channel protection layer is formed of a light-blocking, material, and
the channel protection layer is formed by forming, on top of one another, a plurality of layers including a light-blocking photosensitive resin layer.

16. The method of claim 15, wherein
the plurality of layers formed as the channel protection layer are an insulating resin layer, an oxide semiconductor layer provided above the insulating resin layer, and the light-blocking photosensitive resin layer provided above the oxide semiconductor layer.

17. The method of claim 15, wherein
the aluminum alloy film included in the source and drain electrodes is resistant to heat of 350° C. or more.

18. The method of claim 17, wherein
the aluminum alloy film is formed of an alloy including aluminum as a major component and at least one selected from the group consisting of silicon (Si), neodymium (Nd), copper (Cu), nickel (Ni), and lanthanum (La) as a secondary component.

19. The method of claim 15, wherein
the oxide semiconductor layer is made of an In—Ga—Zn—O metal oxide.

* * * * *